(12) United States Patent
Al-Shyoukh et al.

(10) Patent No.: US 7,215,202 B2
(45) Date of Patent: May 8, 2007

(54) PROGRAMMABLE GAIN AMPLIFIER AND METHOD

(75) Inventors: Mohammad A. Al-Shyoukh, Richardson, TX (US); Alexander Teutsch, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/065,859

(22) Filed: Feb. 25, 2005

(65) Prior Publication Data

US 2006/0192618 A1   Aug. 31, 2006

(51) Int. Cl.
*H03G 3/30* (2006.01)
(52) U.S. Cl. .................... 330/279; 330/129; 330/278
(58) Field of Classification Search .............. None
See application file for complete search history.

(56) References Cited

U.S. PATENT DOCUMENTS

| | | | | |
|---|---|---|---|---|
| 4,016,557 A | * | 4/1977 | Zitelli et al. | 330/124 R |
| 4,553,104 A | * | 11/1985 | Olsen | 330/279 |
| 5,734,596 A | * | 3/1998 | Medelius et al. | 330/124 R |
| 6,628,164 B2 | | 9/2003 | Ramesh et al. | |
| 6,661,283 B1 | | 12/2003 | Lee | |
| 6,768,374 B1 | | 7/2004 | Lee | |
| 7,013,117 B2 | * | 3/2006 | Darabi | 455/240.1 |
| 2005/0189993 A1 | * | 9/2005 | Behzad et al. | 330/284 |

* cited by examiner

*Primary Examiner*—Khanh Van Nguyen
(74) *Attorney, Agent, or Firm*—William B Kempler; W. James Brady; Frederick J. Telecky, Jr.

(57) ABSTRACT

One embodiment of the present invention may include a programmable gain amplifier comprising an input multiplexer operative to sequentially select input signals for amplification. The input signals may be chosen from a plurality of input signals based on a selection signal. The programmable gain amplifier may include at least one amplifier gain stage operative to apply a variable gain amount to a selected input signal. The programmable gain amplifier may further include a gain mapping component that controls the variable gain amount for each of the selected input signals.

26 Claims, 6 Drawing Sheets

PROGRAMMABLE GAIN AMPLIFIER AND METHOD

TECHNICAL FIELD

This invention relates to electronic circuits, and more specifically to a programmable gain amplifier and method.

BACKGROUND

In analog signal processing applications, such as in automotive, wireless communication, or networking applications, it is often necessary to amplify incoming analog signals before they can be processed. Amplifying incoming analog signals is necessary for optimum processing, and typically involves passing input signals through an amplifier.

Programmable gain amplifiers (PGAs) are circuits that allow an input signal to be boosted to a programmed optimum gain level. PGAs can be either single-stage, for lower speed applications requiring only a coarse gain control, or multi-stage, for higher speed applications requiring a fine control of the gain. However, PGAs that operate at higher speeds consume a greater amount of power. Thus, there are competing design constraints between operating speed and power consumption in a PGA. In addition, many circuits may require amplifying more than one analog input signal. This is typically accomplished using multiple dedicated PGAs, one for each analog input signal. However, the demand for smaller and more inexpensive circuit packages stifles the ability to provide high speed programmable amplification to multiple analog signals. Using a dedicated PGA for each channel also requires each of the PGAs to precisely match each other in performance characteristics. The result is an undesired increase in circuit components, and thus die-area, as well as power consumption.

SUMMARY

One embodiment of the present invention may include a programmable gain amplifier comprising an input multiplexer operative to sequentially select input signals for amplification. The input signals may be chosen from a plurality of input signals based on a selection signal. The programmable gain amplifier may include at least one amplifier gain stage operative to apply a variable gain amount to a selected input signal. The programmable gain amplifier may further include a gain mapping component that controls the variable gain amount for each of the selected input signals.

Another embodiment of the present invention may include a multi-channel programmable gain amplifier comprising an input multiplexer operative to sequentially select between a first input signal associated with a first channel and a second input signal associated with a second channel. The multi-channel programmable gain amplifier may include at least one amplifier gain stage operative to apply a variable gain amount to a selected input signal. The multi-channel programmable gain amplifier may also include at least one control multiplexer that selects between providing a first gain control signal that sets the gain for the first input signal and a second gain control signal that sets a gain for the second input signal.

Another embodiment of the present invention may include a method for amplifying a plurality of input signals comprising multiplexing the plurality of input signals based on a selection signal. The selection signal may operate to sequentially select input signals for amplification. The method may also include shifting the selected input signals through at least one amplifier gain stage to provide a set amount of gain to the selected input signals. The method may further comprise applying an amount of gain at each of the at least one amplifier gain stage based on independent gain settings associated with a selected input signal.

Another embodiment of the present invention may include a system for amplifying a plurality of input signals comprising a means for sequentially selecting an input signal for amplification from the plurality of input signals. The system may also include a means for shifting the selected input signal through at least one amplifier gain stage. The system may further comprise a means for varying the amount of gain at the at least one amplifier gain stage based on selecting a gain control signal corresponding to the selected input signal.

DETAILED DESCRIPTION

The present invention relates to electronic circuits, and more specifically to the amplification of one or more analog input signals in a programmable gain amplifier. The programmable gain amplifier could include an input multiplexer operative to sequentially select input signals for amplification from a plurality of input signals based on a selection signal. The selection signal could cycle through the input signals at timed intervals. The programmable gain amplifier could also include at least one amplifier gain stage operative to apply a variable gain amount to a selected input signal. The variable gain amount applied to the selected input signal could be controlled by a gain mapping component, such that a same or different gain amount can be applied to each of the plurality of input signals.

Figure 1:
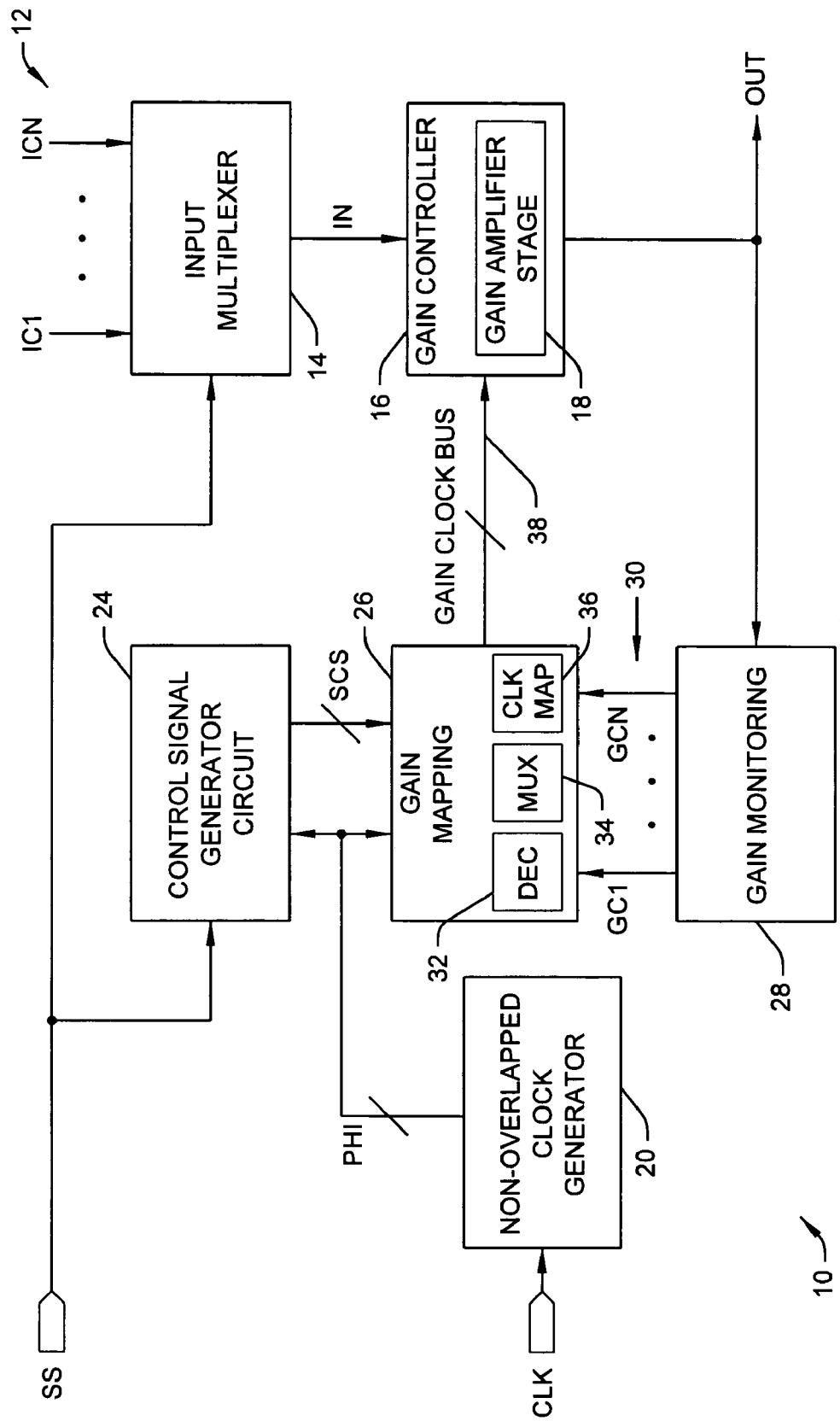
FIG. 1 illustrates a block diagram of a programmable gain amplifier in accordance with an aspect of the invention.

FIG. 1 illustrates a programmable gain amplifier system 10 in accordance with an aspect of the invention. Amplifier system 10 is capable of providing amplification of N number of analog input signals 12, denoted in FIG. 1 as IC1 through ICN. Analog input signals 12 can include a single signal distributed over multiple channels, multiple signals distributed over dedicated channels, or could be independent analog input signals. The analog input signals could also be a single signal that has been phase shift key (PSK) modulated, such as a signal that has been modulated by binary phase shift keying (BPSK), quadrature phase shift keying (QPSK), or any other phase shift keying variation over a plurality of channels. The input signals 12 can also be single ended or differential pairs based on the desired application.

The input signals 12 are coupled to an input multiplexer 14. The input multiplexer 14 also receives a selection signal SS, which could be one or more digital signals for controlling the input to the input multiplexer 14. The selection signal SS selects which of the N input signals 12 to output from the multiplexer 14 at a given time. Selection signal SS could be a timed signal, changing state or toggling between several states at timed intervals based on a system clock or a timer circuit. In such a capacity, the selection signal SS could cycle the multiplexer 14 through each of the N input signals 12 at a timed interval.

The output of the multiplexer 14 is provided as an input signal IN to a gain controller 16. A gain is applied to the input signal IN at the gain controller 16. Gain controller 16 could include a single gain amplifier stage 18 operative to amplify the input signal IN. Alternatively, the gain controller 16 could include a number of separate gain amplifier stages 18, each applying a specific gain amount to the input signal IN at each of the amplifier stages 18. The gain controller 16 could operate, for example, in conjunction with the selection signal SS to alternate a different input signal IN from each of the N input signals 12 sequentially through the gain controller 16 at successive timing intervals. In this way, where the gain controller 16 includes more than one gain amplifier stage 18, gain controller 16 could queue each sequentially selected input signal IN through each successive gain amplifier stage 18 at each successive timing interval, having a different amplification operation performed on it at each successive interval. After applying the one or more amplification operations, the gain controller 16 generates an output signal OUT, which serves as the output of the amplifier system 10.

The amplifier system 10 determines the gain applied at each gain amplifier stage 18 of gain controller 16 through the generation of a number of timing and control signals. The amplifier system 10 receives a system clock signal CLK, such as could be generated by a timing circuit or frequency generator. The system clock signal CLK drives an input to a non-overlapped clock generator circuit 20. The non-overlapped clock generator circuit 20 utilizes the system clock signal CLK to generate a number of clock signals PHI, which could number in quantity equal to the number N of input signals 12. Alternatively, the number of clock signals PHI can be less (e.g., as little as 2) than the number N of input signals 12, and employed to derive other clock signals for providing appropriate timing of the system 10. The clock signals PHI are non-overlapped in that no more than one of the clock signals PHI is asserted (i.e., logic 1) at any given moment in time. That is, a given one of the clock signals PHI is de-asserted (i.e., logic 0) before any other one of the clock signals PHI becomes asserted. The non-overlapped clock generator 20 generates the clock signals PHI from the system clock signal CLK, and thus the clock signals PHI may be timed with the system clock signal CLK.

The non-overlapped clock generator 20 provides the clock signals PHI to both a control signal generator circuit 24 and a gain mapping circuit 26. The control signal generator circuit 24 receives the selection signal SS and the clock signals PHI as inputs. Utilizing these inputs, the control signal generator circuit 24 generates one or more selection control signals SCS. The operation of the control signal generator circuit 24 to generate the selection control signals SCS could be performed, for example, by a series of latches, flip-flops, or other switching or state triggered devices. The selection control signals SCS could include one or more digital signals. The control signal generator circuit 24 outputs the selection control signals SCS to the gain mapping circuit 26.

A gain monitoring circuit 28 receives and monitors the output signals OUT that are output from the gain controller 16. The gain monitoring circuit 28 could monitor the data, for example, by matching data points of a given output signal OUT with the given input signal 12 from which it came, and further with the gain which was applied to the corresponding input signal IN for a closed-loop gain control of the signal. The gain monitoring circuit 28 may include an analog-to-digital converter to convert the analog output signals OUT to a digital form.

The gain monitoring circuit 28 may further include an interface to dynamically program the gains of each of the N input signals 12, which may be programmed independently of each other. The gains of the N input signals 12 may be programmed, for example, by a processor (not shown) and/or a user. The gain monitoring circuit 28, based on gain-setting commands received from the processor and/or user, generates a number of gain control signals 30, designated in FIG. 1 as GC1 through GCN, which could number in quantity equal to the number N of input signals 12. The gain control signals 30 may be multi-bit digital signals with values that correspond to the gain settings desired for each of the N input signals 12, as set by the processor and/or user in the gain monitoring circuit 28. The gain monitoring circuit 28 outputs the gain control signals 30 to the gain mapping circuit 26.

The gain mapping circuit 26 operates to combine the gain settings received from the gain monitoring circuit 28 with the clock signals PHI generated by the non-overlapped clock generator 20 to provide timed gain control to the input signals IN at the gain controller 16 at the timed intervals. The gain mapping circuit 26 may include one or more decoders 32 which decodes the digital gain control signals 30 to generate separate gain control values for each of the gain amplifier stages 18 within the gain controller 16. In this way, a separate gain value, for example, in various degrees of coarse or fine increments, can be communicated to each gain amplifier stage 18 such that each given gain amplifier stage 18 can apply the programmed gain to a given one of the input signals IN at the appropriate time interval. The gain mapping circuit 26 may include a separate decoder 32 for each of the digital gain control signals 30, or the gain mapping circuit 26 could include one decoder 32 to which a given one of the N gain control signals 30 is selected for decoding at a given time, for example, by a multiplexer (not shown).

The gain mapping circuit 26 uses the selection control signals SCS to control one or more multiplexers 34 within the gain mapping circuit 26. The number of multiplexers 34 could be equal to the number of gain amplifier stages 18 in the gain controller 16. The multiplexers 34, using the selection control signals SCS, operate to select a given one of the outputs of the decoder(s) 32, corresponding to a given one of the N input signals 12. An amplification operation is to be performed according to the value of the selected decoder output. The output of the multiplexer(s) 34 would thus correspond to a gain amplification value for the corresponding gain amplifier stage 18 for the input signal IN present at the gain amplifier stage at a given time interval and corresponding to the selected one of the N input signals 12.

One or more clock mapping circuits 36 receive the outputs of the multiplexers 34. The number of clock mapping circuits 36 may be equal to the number of multiplexers 34, and thus may be equal to the number of gain amplifier stages 18 in the gain controller 16. Each clock mapping circuit 36, using the clock signals PHI, converts the output of the corresponding multiplexer 34 into a group of clock-derived signals or gain clock signals. Each clock mapping circuit organizes the clock-derived signals into a specific arrangement timed with the clock signals PHI and outputs them on a gain clock bus 38 to the corresponding gain amplifier stage 18 in the gain controller 16. It is the specific arrangement of the clock-derived signals on the gain clock bus 38 that dictates the amount of gain to apply to each of the given input signals IN at each of the given gain amplifier stages 18 at any given time interval.

Figure 2:
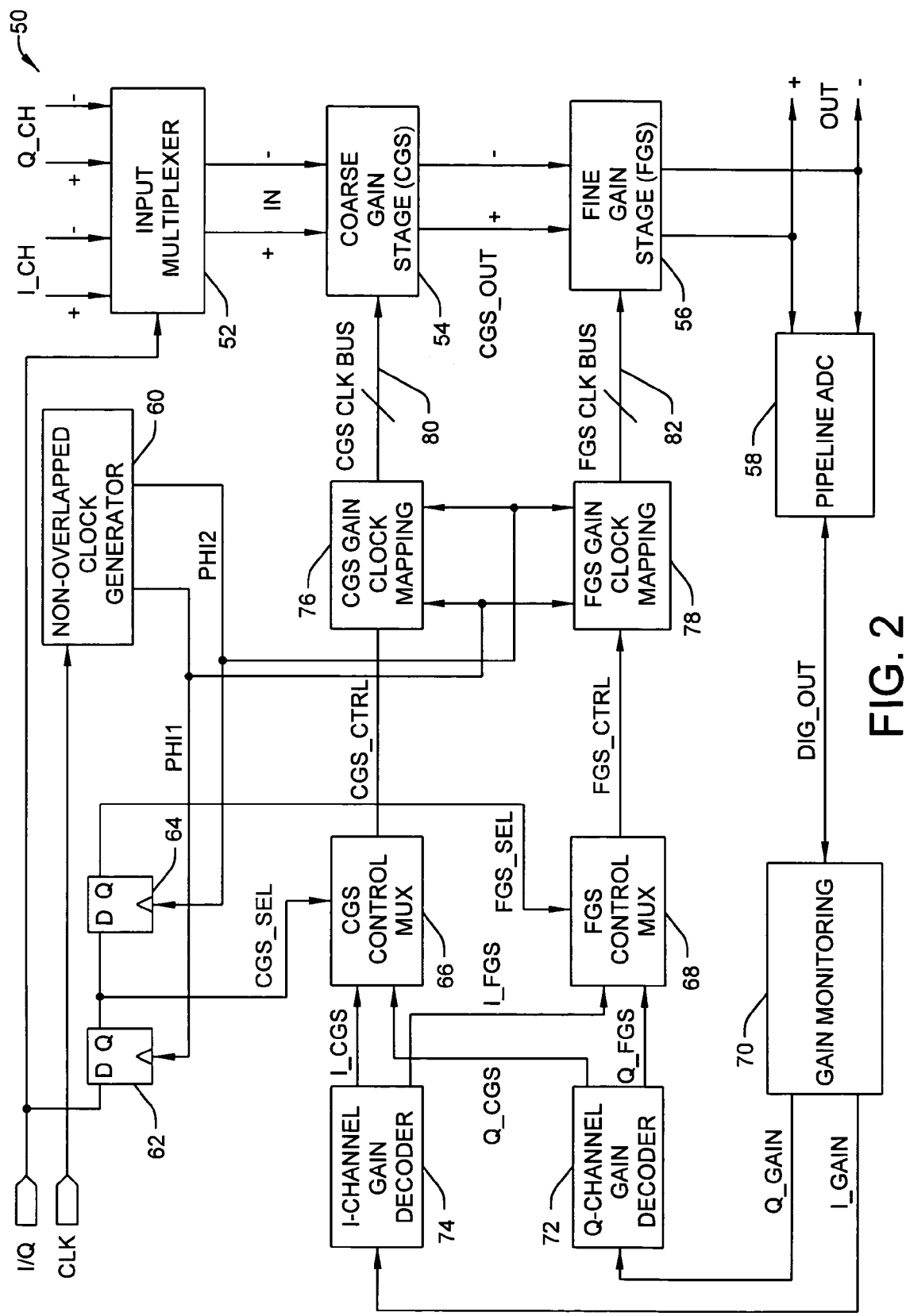
FIG. 2 illustrates another block diagram of a programmable gain amplifier in accordance with an aspect of the invention.

FIG. 2 illustrates an example of a programmable gain amplifier system 50 in accordance with an aspect of the invention. The amplifier system 50 provides amplification of an analog input signal over two separate channels, I_CH and Q_CH. In the example of FIG. 2, the analog input signal has been QPSK modulated to separate the analog signal into the two differential pair channels: in-phase channel I_CH and quadrature channel Q_CH. It is to be appreciated that the input to the amplifier system 50 could include multiple input signals, each of them separately PSK modulated and each of them separated into differential pairs.

Input signals I_CH and Q_CH are coupled to an input signal I/Q multiplexer 52. The input multiplexer 52 also receives a selection signal I/Q for controlling the output of the input multiplexer 52 in the example of FIG. 2. The selection signal I/Q selects which of the input signals I_CH and Q_CH to output as an input signal IN from the input multiplexer 52 at a given time. In the example of FIG. 2, selection signal I/Q changes state at timed intervals and has about twice the period (i.e., half the frequency) as a system clock signal CLK, such as could be generated by a timing circuit or frequency generator. Thus, the selection signal I/Q acts as a timing signal to sequentially alternate the output of the input multiplexer 52 between each of the input signals I_CH and Q_CH at a timed interval substantially at every other rising edge of the clock signal CLK.

The input signal IN selected from the input signals I_CH and Q_CH by the selection signal I/Q is output from the input multiplexer 52 to a coarse gain stage 54, at which a gain can be applied to the input signal IN at substantial increments, such as increments of 6 dB/step. The coarse gain stage 54 is one of two amplifier gain stages in the example of FIG. 2. The other amplifier gain stage is a fine gain stage 56, at which smaller gain increments, such as 0.375 dB/step, are applied to a CGS_OUT signal which is output from the coarse gain stage 54. It is to be appreciated that the CGS_OUT signal is a given signal IN having been amplified by the coarse gain stage 54 during a given selection signal I/Q time interval.

The coarse gain stage 54 and the fine gain stage 56 could operate, for example, in conjunction with the selection signal I/Q to alternate between the input signals I_CH and Q_CH and sequentially pass a signal IN from each of them through both the coarse gain stage 54 and the fine gain stage 56 at each successive timing interval of the selection signal I/Q. Thus, the selection signal I/Q could sequentially alternate between signals IN corresponding respectively to the input signals I_CH and Q_CH, each of the signals IN being subjected to a coarse gain amplification and a subsequent fine gain amplification. After applying the fine gain amplification, the fine gain stage 56 generates an output signal OUT, which serves as the output of the amplifier system 50. In addition, in the example of FIG. 2, a pipeline analog-to-digital converter (ADC) 58 receives the output signal OUT. The pipeline ADC converts the analog output signal OUT to a digital output signal DIG_OUT.

The amplifier system 50 determines the amount of gain applied at both the coarse gain stage 54 and the fine gain stage 56 through the generation of a number of timing and control signals. The system clock signal CLK drives an input to a non-overlapped clock generator circuit 60. In the example of FIG. 2, the non-overlapped clock generator circuit 60 utilizes the system clock signal CLK to generate clock signals PHI1 and PHI2. The clock signals PHI1 and PHI2 are non-overlapped in that no more than one of the clock signals PHI1 and PHI2 is asserted at any given moment in time. That is, a given one of the clock signals PHI1 and PHI2 is de-asserted before the other of the clock signals PHI1 and PHI2 becomes asserted. Non-overlapped clock generator circuit 60 generates the clock signals PHI1 and PHI2 from the system clock signal CLK, and thus the clock signals PHI1 and PHI2 are substantially timed with the system clock signal CLK in the example of FIG. 2. Because the clock signals PHI1 and PHI2 are non-overlapping and substantially timed with the system clock CLK, it is to be appreciated that the clock signals PHI1 and PHI2 are out of phase by about 180° relative to each other.

Figure 3:
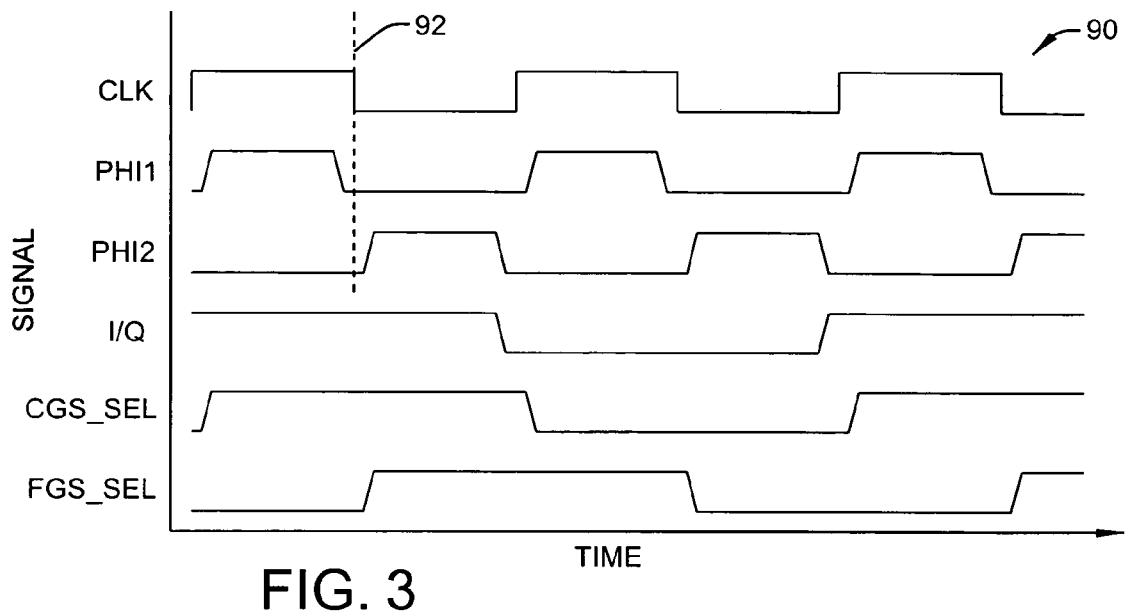
FIG. 3 illustrates a timing diagram of a programmable gain amplifier in accordance with an aspect of the invention.

FIG. 3 depicts a timing diagram 90 demonstrating the relative timing of the system clock signal CLK, the non-overlapping clock signals PHI1 and PHI2, and the selection signal I/Q. It is to be appreciated that the timing diagram 90 of FIG. 3 is an ideal timing diagram, and thus does not show switching or propagation delays that will be inherent to the system. In the timing diagram 90, the clock signal PHI1 is asserted at substantially the same time as the system clock signal CLK, except that it is asserted slightly delayed after a rising edge of the system clock signal CLK. Likewise, the clock signal PHI2 is asserted at substantially the same time that the system clock signal CLK is de-asserted, except that it is slightly delayed after a falling edge of the system clock signal CLK. The result is that each of the clock signals PHI1 and PHI2 are asserted for a shorter duration relative to the time that they are de-asserted. This relative timing is necessary for the clock signals PHI1 and PHI2 to be non-overlapping, which is demonstrated by a dashed line 92. The dashed line 92 is substantially in line with a falling edge of the system clock signal CLK, but is slightly after a falling edge of the clock signal PHI1 and slightly before a rising edge of the clock signal PHI2. FIG. 3 also illustrates that the selection signal I/Q is substantially timed with the falling edges of the clock signal PHI2, and that it has about twice the period (i.e., half the frequency) as the system clock signal CLK and the clock signals PHI1 and PHI2.

Referring back to FIG. 2, the non-overlapped clock generator 60 provides the clock signal PHI1 to a D flip-flop 62 and the clock signal PHI2 to a D flip-flop 64. The D flip-flops 62 and 64 create control signals CGS_SEL and FGS_SEL, respectively, that are used as control signals to a CGS control multiplexer 66 and a FGS control multiplexer 68. It is to be appreciated that the example of the amplifier system 50 in FIG. 2 is not limited by the use of D flip-flops to generate the control signals CGS_SEL and FGS_SEL. Other state triggered digital devices could also be used to generate the control signals CGS_SEL and FGS_SEL. The D flip-flop 62 receives the selection signal I/Q and latches its current state at a rising edge of the clock signal PHI1. The output of the D flip-flop 62 is the control signal CGS_SEL, which drives an input to both the CGS control multiplexer 66 and the D flip-flop 64. The D flip-flop 64 latches the state of the control signal CGS_SEL at a rising edge of the clock signal PHI2. The output of the D flip-flop 64, which is the control signal FGS_SEL, drives an input to the FGS control multiplexer 68. Because the D flip-flop 62 latches the selection signal I/Q on a rising edge of the clock signal PHI1, and because the D flip-flop 64 latches the output of the D flip-flop 62 on a rising edge of the clock signal PHI2, it is to be appreciated that the control signals CGS_SEL and FGS_SEL are out of phase by about 90° relative to each other with a period that is about the same as the selection signal I/Q. This relative timing of the control signals CGS_SEL and FGS_SEL, as compared with the selection signal I/Q, is better demonstrated with reference to FIG. 3.

In the example of FIG. 2, a gain monitoring circuit 70 receives and monitors the digital output signals DIG_OUT that are output from the pipeline ADC 58. The gain monitoring circuit 70 could monitor the data, for example, by matching data points of a given output signal DIG_OUT with the given input signal I_CH and Q_CH from which it came, and further with the gains that were applied to the corresponding input signal IN at the coarse gain stage 54, or the signal CGS_OUT at the fine gain stage 56, for a closed-loop gain control of the signal.

The gain monitoring circuit 70 may further include an interface to dynamically program the gains of the input signals I_CH and Q_CH, which may be programmed dynamically and independently of each other. The gains of the input signals I_CH and Q_CH may be programmed, for example, by a processor (not shown) and/or a user. The gain monitoring circuit 70, based on gain-setting commands received from the processor and/or user, generates gain control signals Q_GAIN and I_GAIN. The gain control signals Q_GAIN and I_GAIN may be multi-bit digital signals with values that correspond to the gain settings desired for each of the input signals I_CH and Q_CH, as programmed by the processor and/or user in the gain monitoring circuit 70. The gain monitoring circuit 70 outputs the gain control signals Q_GAIN and I_GAIN to a Q-channel gain decoder 72 and an I-channel gain decoder 74, respectively.

The Q-channel gain decoder 72 receives and decodes the gain control signal Q_GAIN, for example, by using combinational logic to generate separate gain control values for the coarse gain stage 54 and the fine gain stage 56 for the input signal Q_CH. The Q-channel gain decoder 72 outputs these gain control values as gain signals Q_CGS, which carries the gain control values for the coarse gain stage 54, and Q_FGS, which carries the gain control values for the fine gain stage 56. The I-channel gain decoder 74 receives and decodes the gain control signal I_GAIN, for example, by using combinational logic to generate separate gain control values for the coarse gain stage 54 and the fine gain stage 56 for the input signal I_CH. The I-channel gain decoder 74 outputs these gain control values as gain signals I_CGS, which carries the gain control values for the coarse gain stage 54, and I_FGS, which carries the gain control values for the fine gain stage 56. In this way, separate gain values, for example, in various degrees of coarse and fine increments, are communicated to the coarse gain stage 54 and the fine gain stage 56, respectively, such that the stages can each apply the programmed gain amount to the input signals I_CH or Q_CH at the appropriate time interval dictated by the selection signal I/Q. The example of FIG. 2 includes a separate decoder for each of the digital gain control signals Q_GAIN and I_GAIN. It is to be appreciated, however, that other combinations of decoders and multiplexers could be used to separate the coarse and fine gain settings from the gain control signals Q_GAIN and I_GAIN. The Q-channel gain decoder 72 and the I-channel gain decoder 74 respectively output the gain signals Q_CGS and I_CGS to the CGS control multiplexer 66. Similarly, the Q-channel gain decoder 72 and the I-channel gain decoder 74 respectively output the gain signals Q_FGS and I_FGS to the FGS control multiplexer 68.

The CGS control multiplexer 66 uses the control signal CGS_SEL to select between the decoded gain signals Q_CGS and I_CGS. Likewise, the FGS control multiplexer 68 uses the control signal FGS_SEL to select between the decoded gain signals Q_FGS and I_FGS. The CGS and FGS control multiplexers 66 and 68 output the selected decoded gain signals CGS_CTRL and FGS_CTRL, respectively, to a CGS gain clock mapping circuit 76 and a FGS gain clock mapping circuit 78. These selected decoded gain signals may be multi-bit digital signals that include the programmed gain information for the coarse gain stage 54 and the fine gain stage 56 corresponding to the input signal I_CH or Q_CH at the appropriate time interval selected by the selection signal I/Q.

The CGS gain clock mapping circuit 76 receives the CGS_CTRL signal output from the CGS control multiplexer 66, and the FGS gain clock mapping circuit 78 receives the FGS_CTRL signal output from the FGS control multiplexer 68. The CGS gain clock mapping circuit 76 uses the clock signals PHI1 and PHI2 to convert the multi-bit data in the CGS_CTRL signal into an array of clock-derived signals or gain clock signals. The CGS gain clock mapping circuit 76 organizes the array of clock-derived signals into a specific arrangement timed with the clock signals PHI1 and PHI2 and outputs them on a CGS clock bus 80 to the coarse gain stage 54. It is the specific arrangement of the clock-derived signals on the CGS clock bus 80 that dictates the amount of gain to apply to the given input signals IN at the coarse gain stage 54 at any given time interval. In a similar fashion, the FGS gain clock mapping circuit 78 uses the clock signals PHI1 and PHI2 to convert the multi-bit data in the FGS_CTRL signal into an array of clock-derived signals. The FGS gain clock mapping circuit organizes the array of clock-derived signals into a specific arrangement timed with the clock signals PHI1 and PHI2 and outputs them on a FGS clock bus 82 to the fine gain stage 56. It is the specific arrangement of the clock-derived signals on the FGS clock bus 82 that dictates the amount of gain to apply to the given output signals CGS_OUT at the fine gain stage 56 at any given time interval.

Figure 4:
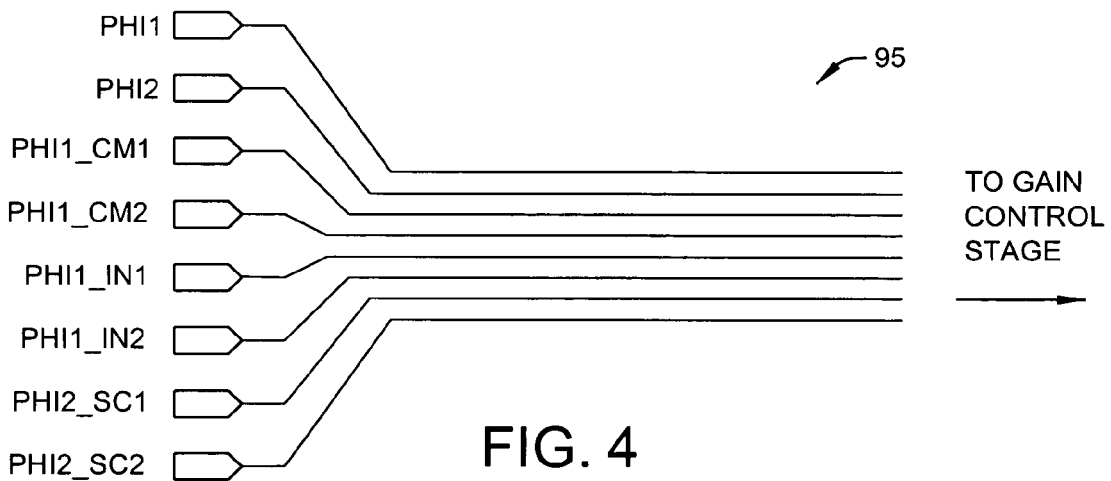
FIG. 4 illustrates a bus for controlling a switched capacitor gain stage circuit in a programmable gain amplifier in accordance with an aspect of the invention.

FIG. 4 depicts an example of a clock bus 95, such as the CGS clock bus illustrated in FIG. 2, operative to propagate the clock-derived signals or gain clock signals from a gain clock mapping circuit, such as the CGS gain clock mapping circuit 76 as depicted in FIG. 2, to a gain amplifier stage, such as the coarse gain stage 54. The clock bus 95 of FIG. 4 includes eight separate signals: clock signals PHI1 and PHI2, and clock-derived signals PHI1_CM1, PHI1_CM2, PHI1_IN1, PHI1_IN2, PHI2_SC1, and PHI2_SC2. It is to be appreciated that the clock signals PHI1 and PHI2 need not be part of the same bus as the clock-derived signals, as depicted in FIG. 4. These eight signals travel along the clock bus 95 from a gain clock mapping circuit to a gain amplifier stage, such that the given gain amplifier stage uses the signals to control the amount of amplification of a given input signal, as will be discussed further with regard to FIG. 5.

Figure 5:
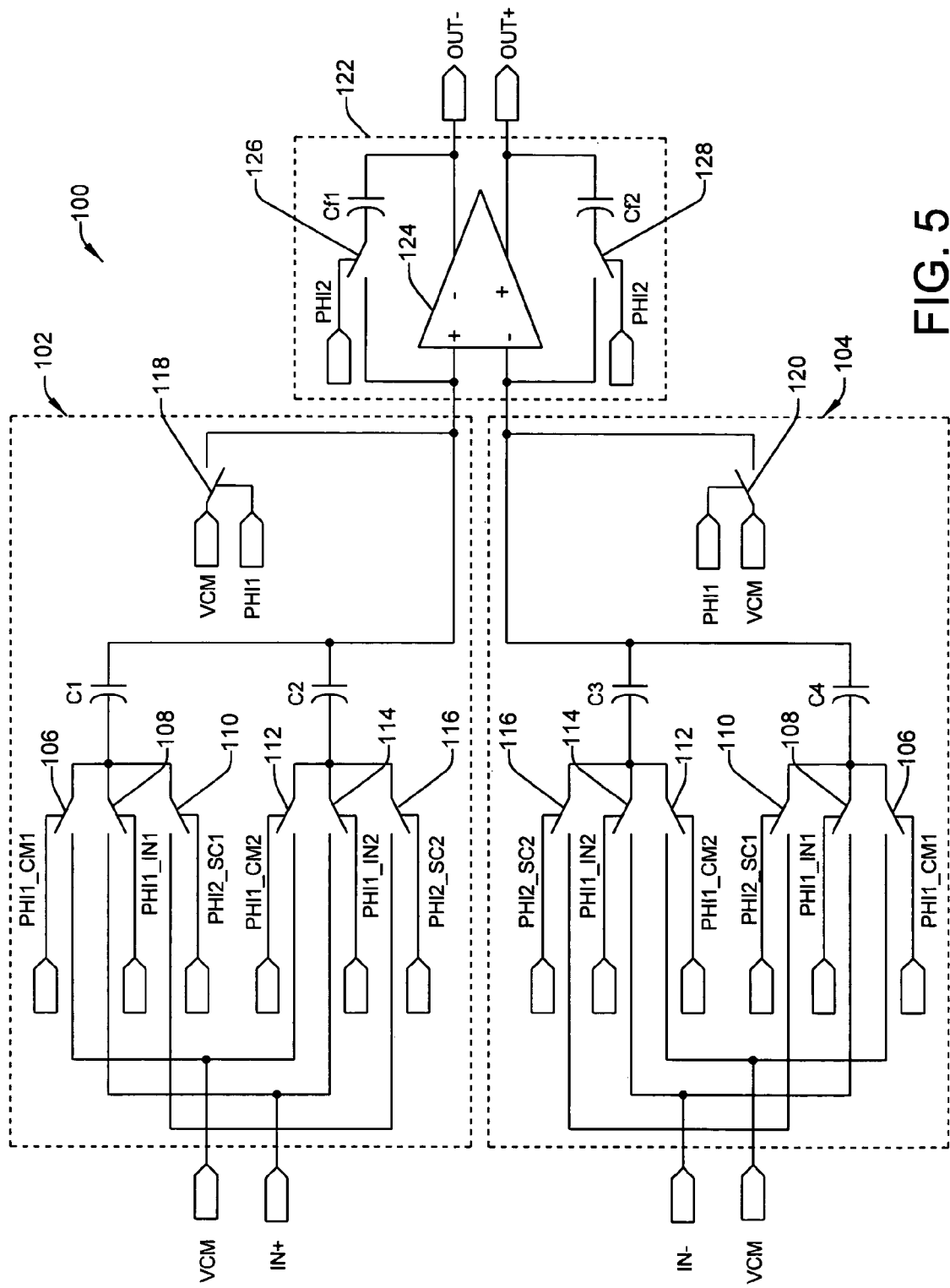
FIG. 5 illustrates a switched capacitor gain stage circuit in accordance with an aspect of the invention.

FIG. 5 is an example of a gain amplifier stage 100, such as described herein, that receives an analog differential signal IN and outputs an amplified analog differential signal OUT. The example gain amplifier stage 100 of FIG. 5 is depicted as a switched capacitor gain stage. However, it is to be appreciated that any type of adjustable analog signal amplifier could be used in accordance with an aspect of the invention. The gain amplifier stage 100 receives the positive signal IN+ from the analog differential input signal IN, the negative signal IN− from the analog differential input signal IN, and the common mode voltage signal VCM associated with the differential signal pair of the analog differential input signal IN. The positive signal IN+ is received by an input stage 102, while the negative signal IN− is received by an input stage 104. The common mode voltage signal VCM is received by both the input stage 102 and the input stage 104.

Each of the input stages 102 and 104 also receives a series of clock-derived or gain clock input signals PHI1_CM1, PHI1_CM2, PHI1_IN1, PHI1_IN2, PHI2_SC1, and PHI2_SC2, such as those that could be generated from the gain clock mapping circuits and sent across the clock busses, as described previously with regard to FIGS. 2 and 4. The clock-derived signals, when asserted, are asserted substantially in time with the clock signal from which they are derived, such that the clock-derived signals PHI1_X are substantially timed with the clock signal PHI1, and the clock-derived signals PHI2_X are substantially timed with the clock signal PHI2. For example, when a gain clock mapping circuit determines that the clock-derived signal PHI1_IN1 is to be asserted to achieve a certain gain at a certain gain stage, PHI1_IN1 will be substantially in time with the clock signal PHI1.

Each of the clock-derived input signals in the example of FIG. 5 operates to open and close a given switch in an array of switches included in the input stages 102 and 104. In the example of FIG. 5, the clock-derived signal PHI1_CM1 operates a switch 106, the clock-derived signal PHI1_IN1 operates a switch 108, and the clock-derived signal PHI2_SC1 operates a switch 110. Similarly, the clock-derived signal PHI1_CM2 operates a switch 112, the clock-derived signal PHI1_IN2 operates a switch 114, and the clock-derived signal PHI2_SC2 operates a switch 116. The switches 106, 108, 110, 112, 114, and 116 can be normally open or normally closed switches, such that a given switch can be opened or closed when the given clock-derived signal which controls it is asserted. In the example of FIG. 5, all the switches 106, 108, 110, 112, 114, and 116 are closed when the respective clock-derived signal is asserted. It is to be further appreciated that, in the example of FIG. 5, the input stage 102 and the input stage 104 are a mirror image of each other. Accordingly, like reference numbers are used to describe the switches that are manipulated by like clock-derived signals. For example, the clock-derived signal PHI1_CM1, when asserted, closes the switch 106 in the input stage 102 and the switch 106 in the input stage 104.

The gain amplifier stage 100 includes four input capacitors, C1, C2, C3, and C4. Capacitors C1 and C2 are electrically coupled to the switch array in the input stage 102 while capacitors C3 and C4 are electrically coupled to the switch array in the input stage 104. It is to be appreciated that the capacitance values of capacitors C1, C2, C3, and C4 are all identical ("C") in the example of FIG. 5. However, the capacitance values of capacitors C1, C2, C3, and C4 need not be uniform, and that the number of capacitors need not be limited to four. Fewer or additional sets of capacitors with corresponding switches may be added to or subtracted from the input stages 102 and 104 to achieve different gains at the output of the gain amplifier stage 100.

Electrically coupled to the opposite terminal of capacitors C1 and C2 in the input stage 102 is a switch 118, and electrically coupled to the opposite terminal of capacitors C3 and C4 in the input stage 104 is a switch 120. The switches 118 and 120 operate to connect the opposite terminal of each of the capacitors to the common mode voltage source VCM upon assertion of the clock signal PHI1. The clock signal PHI1 could come from a clock bus that propagates the clock-derived input signals, or it could come from another source. When the clock signal PHI1 is de-asserted, the switches 118 and 120 are open.

In the example of FIG. 5, the gain amplifier stage 100 receives the clock-derived signals PHI1_CM1, PHI1_CM2, PHI1_IN1, PHI1_IN2, PHI2_SC1, and PHI2_SC2 from a clock bus, such as the CGS clock bus 80 of FIG. 2. The clock-derived signals are arranged in a combination to control the switches 106, 108, 110, 112, 114, and 116 relative to the switches 118 and 120 to supply a charge on each of the respective capacitors C1, C2, C3, and C4 relative to the common mode voltage VCM. For example, because the clock-derived signal PHI1_IN1 is substantially timed with the clock signal PHI1, both the switch 108 and the switch 118 will be closed at substantially the same time when the clock-derived signal PHI1_IN1 is asserted. This results in the capacitor C1 sampling the positive analog input signal IN+ by collecting a charge that is equal to $C^*((IN+)-(VCM))$ while the switches 108 and 118 are both closed. Likewise, the capacitor C4 will sample the negative analog input signal by collecting a charge equal to $C^*((IN-)-(VCM))$ while the switches 108 and 120 are both closed. The result will be the same for the capacitors C2 and C3, respectively, when the switches 114, 118, and 120 are respectively closed concurrently.

The amount of gain realized by the gain amplifier stage 100 is dependent on the combination of charge on the capacitors C1, C2, C3, and C4. This combination of charge is dependent on the combination of clock-derived input signals supplied to the gain amplifier stage 100, such as by the CGS gain clock mapping circuit 80 of FIG. 2. Thus, if a charge on the capacitors C1 and C4 is not desired, the CGS gain clock mapping circuit 80 asserts the clock-derived signal PHI1_CM1 instead of the clock-derived signal PHI1_IN1. Because both the clock-derived signal PHI1_CM1 and the clock signal PHI1 are substantially timed together, assertion of the clock-derived signal PHI1_CM1 will close the switch 106 concurrently with the switches 118 and 120. Thus, instead of the capacitors C1 and C4 receiving a charge of $C^*((IN+)-(VCM))$ and $C^*((IN-)-(VCM))$, respectively, due to the closure of the switches 108, 118, and 120, the capacitors C1 and C4 become electrically connected to the common mode voltage source VCM on both of their respective plates and receive a charge of $C^*((VCM)-(VCM))=0$ as a result of the closure of the switches 106, 118, and 120.

It is to be appreciated that the pair of signals PHI1_IN1 and PHI1_CM1, despite both being substantially timed to the clock-derived signal PHI1, are asserted mutually exclusive of each other. Closure of both the switches 106 and 108 concurrently as a result of the assertion of both the signals PHI1_IN1 and PHI1_CM1 would result in a short circuit between the positive analog input signal IN+ and the common mode voltage source VCM. It is to be further appreciated that the above described operation of supplying a charge on the capacitors C1 and C4 based on the operation of the switches 106 and 108 by assertion of the signals PHI1_IN1 and PHI1_CM1 applies also to the capacitors C2 and C3 based on the operation of the switches 112 and 114 by the assertion of the signals PHI1_IN2 and PHI1_CM2.

Thus, in the example of FIG. 5, the gain amplifier stage 100 may have four possible combinations of charges on the capacitors C1, C2, C3, and C4. In the first possible combination, the charge on capacitors C1 and C2=C*((IN+)−(VCM)), and the charge on capacitors C3 and C4=C*((IN−)−(VCM)). In the second possible combination, the charge on capacitor C1=C*((IN+)−(VCM)), the charge on capacitor C4=C*((IN−)−(VCM)), and the charge on capacitors C2 and C3=C*((VCM)−(VCM))=0. In the third possible combination, the charge on capacitor C2=C*((IN+)−(VCM)), the charge on capacitor C3=C*((IN−)−(VCM)), and the charge on capacitors C1 and C4=C*((VCM)−(VCM))=0. In the fourth and final possible combination, the charge on capacitors C1, C2, C3, and C4=C*((VCM)−(VCM))=0.

When the gain amplifier stage 100 finishes a sampling phase of collecting the analog input signal IN onto the combination of the capacitors C1, C2, C3, and C4, it then transfers the analog input charges from the input stages 102 and 104 to an output stage 122 during a hold phase. The output stage 122 includes an operational amplifier (OP AMP) 124. The input stage 102 is coupled to a positive input of the OP AMP, and the input stage 104 is coupled to a negative input of the OP AMP. Coupled between the positive input and a negative output of the OP AMP 124 is a switch 126 and a capacitor Cf1. Coupled between the negative input and a positive output of the OP AMP 124 is a switch 128 and a capacitor Cf2. The switches 126 and 128 operate to electrically connect the capacitors C1 and C2 with the capacitor Cf1, and to electrically connect the capacitors C3 and C4 with the capacitor Cf2, upon assertion of the clock signal PHI2.

Because the clock-derived signals PHI2_SC1 and PHI2_SC2 are substantially timed with the clock signal PHI2, the switches 110, 116, 126, and 128 will close at substantially the same time. When the switch 110 closes, the negative terminals of the capacitors C1 and C2 are short circuited together, thus disconnecting them from the common mode voltage VCM and the positive analog input IN+. Similarly, when the switch 116 closes, the negative terminals of the capacitors C3 and C4 are short circuited together, thus disconnecting them from the common mode voltage VCM and the negative analog input IN−. When the switches 110, 116, 126, and 128 are closed, the switches 118 and 120 will be open, thus disconnecting the common mode voltage source VCM from the positive terminals of the input capacitors C1, C2, C3, and C4, and from the negative terminals of the output capacitors Cf1 and Cf2. Therefore, when the switches 110, 116, 126, and 128 close at substantially the same time, the combined charge collected on the capacitors C1 and C2 is transferred to the capacitor Cf1, and the combined charge collected on the capacitors C3 and C4 is transferred to the capacitor Cf2. It is at the falling edge of the clock signal PHI2 (the end of a hold phase), right before the switches 126 and 128 open, that the full gain of the gain amplifier stage 100 is realized at the differential analog output signals OUT+ and OUT− relative to the differential analog input signals IN+ and IN−. The gains represented at the end of the hold phase are thus represented as follows:

$$\text{Gain}_{1234} = 2C/Cf. \quad \text{Equation 1}$$

$$\text{Gain}_{12} = \text{Gain}_{34} = C/Cf. \quad \text{Equation 2}$$

The subscripts in Equations 1 and 2 correspond to the numbers of the capacitors that had sampled the analog inputs IN+ and IN− during the sample phase by assertion of the clock-derived signals PHI1_IN1 and PHI1_IN2. It is to be appreciated that Equations 1 and 2 assume the same value for the capacitance ("C") of the capacitors C1, C2, C3, and C4 relative to each other, and further assumes the same value for the capacitors Cf1 and Cf2 ("Cf") relative to each other. Additional capacitors added in parallel to the two input stages 102 and 104 in a like fashion relative to each other would thus produce a range of capacitance from C/Cf to nC/Cf, in increments of "C", where "n" is equal to the number of parallel capacitors, all of the same capacitance value, in each of the input stages 102 and 104. It is to be further appreciated that, to determine the gain in decibels, one need only take twenty times the logarithmic value of the calculated gain, such that (working from Equations 1 and 2):

$$\text{Gain}_{1234}(\text{dB}) = 20 \log(2C/Cf). \quad \text{Equation 3}$$

$$\text{Gain}_{12}(\text{dB}) = \text{Gain}_{34}(\text{dB}) = 20 \log(C/Cf). \quad \text{Equation 4}$$

The gain amplifier stage 100, as previously described, is an example of a coarse gain stage 54 as depicted in FIG. 2. A fine gain stage 56, as depicted in FIG. 2, could also be suitably represented by the example of the gain amplifier stage 100 in FIG. 5 with notable exceptions. In order to achieve smaller gain increments, such as fine increments of 0.375 dB instead of coarse increments such as 6 dB, different capacitance values for the capacitors C1, C2, C3, and C4, and for the capacitors Cf1 and Cf2 could be chosen. Additionally, further to the example of FIG. 2, the clock-derived signals would be out of phase of each other by about 180° for the fine gain stage 56 relative to the coarse gain stage 54. Specifically, the clock-derived signals for the fine gain stage 56 that could control the switches for the sampling of charges onto the capacitors in the input stages 102 and 104 could be substantially timed with the clock signal PHI2, and not the clock signal PHI1 as described previously with regard to the coarse gain stage example of FIG. 5. Therefore, when the clock signal PHI1 is asserted, the coarse gain stage 54 could be sampling while the fine gain stage 56 is holding. Similarly, when the clock signal PHI2 is asserted, the coarse gain stage 54 could be holding while the fine gain stage 56 is sampling.

Figure 6:
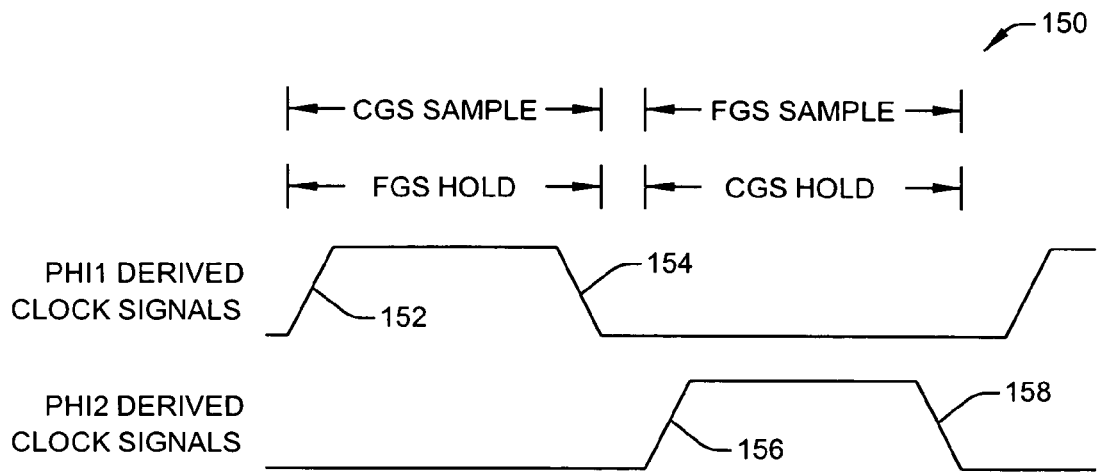
FIG. 6 illustrates a timing diagram of a switched capacitor gain stage circuit in accordance with an aspect of the invention.

FIG. 6 depicts a timing diagram 150 showing the timing relationship between the coarse gain stage 54 and the fine gain stage 56. In FIG. 6, the gain clock signals derived from the clock signal PHI1 (PHI1 derived clock signals), such as PHI1_IN1, PHI1_IN2, PHI1_CM1, and PHI1_CM2, are asserted first. When the PHI1 derived clock signals are asserted at a rising edge 152, FIG. 5 illustrates that the coarse gain stage (CGS) is in a sample phase, and is thus collecting a charge on the capacitors included in the input stages. Concurrently, the fine gain stage (FGS) is in a hold phase, and is thus transferring the charge from the capacitors included in the input stages to the capacitors in the output stage. Thus, at the falling edge 154 of the PHI1 derived clock signals, the FGS hold phase is over and the full gain is realized at the output of the fine gain stage. When the PHI1 derived clock signals have become completely de-asserted, the gain clock signals derived from PHI2 (PHI2 derived clock signals) become asserted at a rising edge 156. It is only after the PHI1 derived clock signals have been completely de-asserted that the PHI2 derived clock signals begin assertion because the clock signals PHI1 and PHI2 are non-overlapping. While the PHI2 derived clock signals are asserted, FIG. 5 illustrates that the fine gain stage is in a sample phase, and is thus collecting a charge on the capacitors included in the input stages. Concurrently, the coarse gain stage is in a hold phase, and is thus transferring the charge from the capacitors included in the input stages to the capacitors in the output stage. Thus, at the falling edge 158 of the PHI2 derived clock signals, the CGS hold phase is over and the full gain is realized at the output of the coarse gain stage. Through the alternating sequence of sample and hold phases of the coarse gain stage and the fine gain stage, a given analog input signal alternates between a coarse gain adjustment followed by a fine gain adjustment before being output by the programmable gain amplifier. Accordingly, a given input signal is amplified by the sum of the gain, in dB, resulting from the coarse gain stage amplification and the subsequent fine gain stage amplification.

Figure 7:
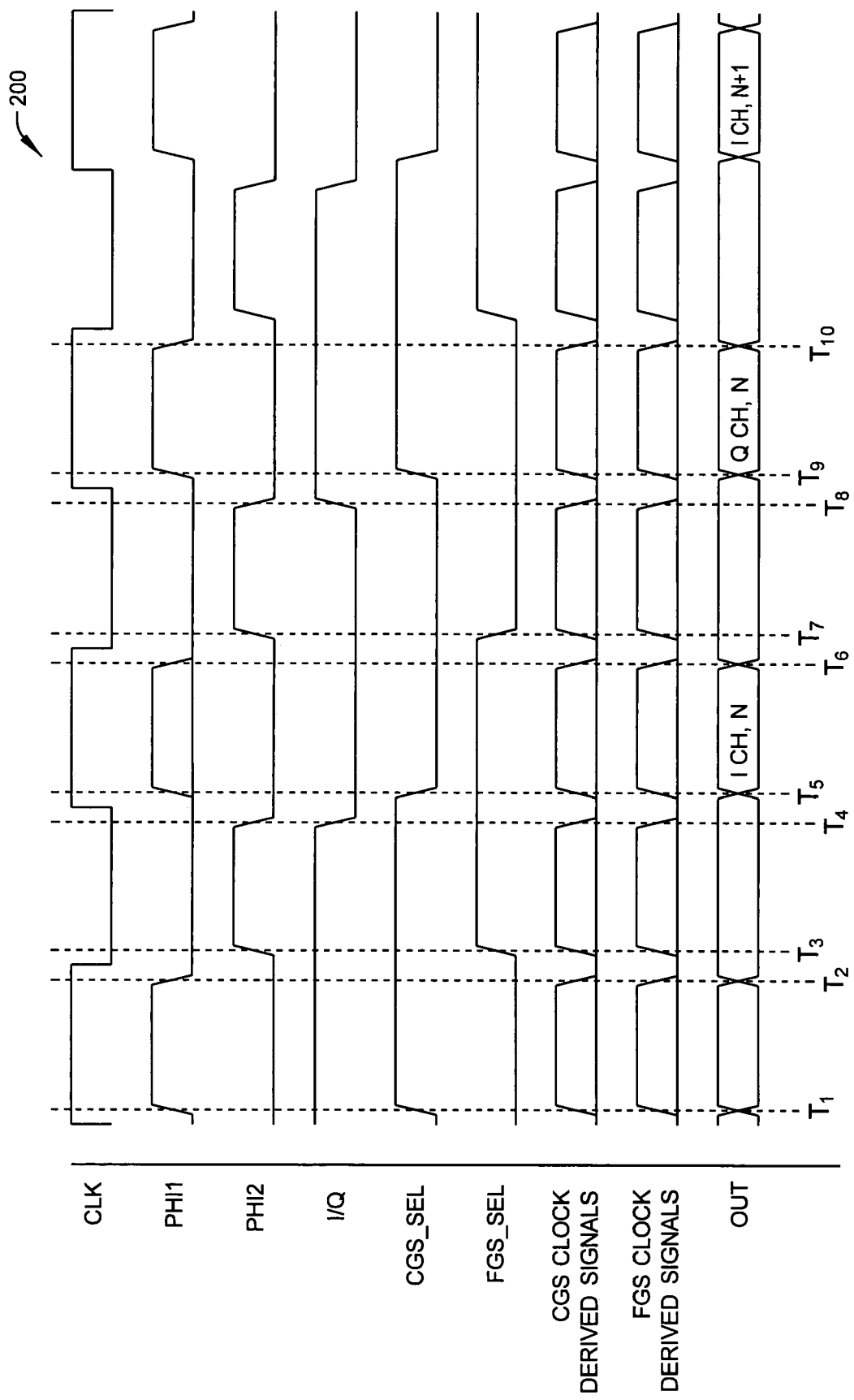
FIG. 7 illustrates another timing diagram of a programmable gain amplifier in accordance with an aspect of the invention.

A better demonstration of the relative action of separate coarse gain and fine gain amplifications of multiple input signals in a programmable gain amplifier is further demonstrated with reference to FIG. 7. FIG. 7 depicts an example of a timing diagram 200 for signals employed in a programmable gain amplifier, such as that described above with regard to FIG. 2. The programmable gain amplifier can utilize a coarse gain stage and a fine gain stage, which could be switched capacitor gain stages such as described above regarding FIG. 5. It is to be appreciated that the timing diagram 200 of FIG. 7 is an ideal timing diagram, and thus does not show switching or propagation delays that will be inherent to the system. Timing diagram 200 includes the relative timing of a system clock signal CLK, such as could be generated by a frequency generator or timing circuit, with a pair of clock signals PHI1 and PHI2 generated from the system clock signal CLK. The timing diagram 200 further includes a selection signal I/Q which could be used to sequentially select from an input multiplexer between an I-channel and a Q-channel of an analog input signal for which a programmable gain will be applied by the programmable gain amplifier. The timing diagram 200 also includes two control signals CGS_SEL and FGS_SEL, which could be used to select between the I-channel and the Q-channel at a set of multiplexers, such as the CGS control multiplexer 66 and the FGS control multiplexer 68 in FIG. 2, for determining to which of the input signals to apply a gain. The gain control of the coarse gain stage and the fine gain stage can be controlled by an array of clock-derived signals or gain clock signals generated by a circuit such as the CGS gain clock mapping circuit 76 and the FGS gain clock mapping circuit 78 of FIG. 2. The relative timing of the clock-derived signals is represented in the timing diagram 200 by CGS clock-derived signals and FGS clock-derived signals. The timing diagram 200 also includes a representation of the output data, OUT, to display the timing of when a given amplified output signal is at the output of the programmable gain amplifier.

At a time $T_1$, the selection signal I/Q is high (i.e., logic 1), thus the I-channel is selected from the input multiplexer to apply a programmable gain to an input signal N. The control signal CGS_SEL is high, therefore the clock-derived signals on CGS CLK BUS are arranged to control a pre-programmed coarse gain of the I-channel of the signal N. The coarse gain could be pre-programmed, for example, by a user or a processor. Thus, at time $T_1$, the coarse gain stage of the programmable gain amplifier begins a sampling phase by applying a coarse gain amount dictated by the arrangement of the clock-derived signals on CGS CLK BUS to the I-channel of the signal N, such as described above with regard to FIGS. 5 and 6.

At a time $T_2$, the clock-derived signals on the CGS CLK BUS go low (i.e., logic 0), thus the coarse gain stage of the programmable gain amplifier ends the sampling phase, such as by acquiring the full amount of a charge on an array of input capacitors, as described above regarding FIG. 5. At a time $T_3$, the selection signal I/Q is still high, thus the programmable gain amplifier is still applying a gain to the I-channel of the signal N. The FGS_SEL signal goes high at the time $T_3$, thus the fine gain stage receives a pre-programmed arrangement of clock-derived signals on FGS CLK BUS to apply a fine gain to the I-channel of the signal N. Accordingly, it is at the time $T_3$ that the coarse gain stage of the programmable gain amplifier begins a hold phase, such as by transferring charges on an array of input capacitors to output capacitors as described above regarding FIG. 5. At the same time $T_3$, the fine gain stage of the programmable gain amplifier begins a sample phase. This could occur by the fine gain stage collecting a charge on an array of input capacitors based on an input to the fine gain stage that is the coarse gain amplified I-channel of the signal N. This could be the signal CGS_OUT, in the example of FIG. 2, that is output from the coarse gain stage during its respective hold phase.

At a time $T_4$, the clock-derived signals on the FGS CLK BUS go low, thus the fine gain stage of the programmable gain amplifier ends the sampling phase, such as by acquiring the full amount of charge on the array of input capacitors, as described above regarding FIG. 5. It is also at the time $T_4$ that the clock-derived signals on CGS CLK BUS go low, thus the coarse gain stage has fully concluded its hold phase. The entirety of the coarse gain applied to the I-channel of the signal N has been realized at the output of the coarse gain stage, and has thus been fully sampled by the downstream fine gain stage. Also occurring at the time $T_4$, the selection signal I/Q goes low. The input multiplexer therefore switches to the Q-channel to apply a programmable gain to the Q-channel of the signal N.

At a time $T_5$, the control signal CGS_SEL goes low. Therefore, the clock-derived signals on CGS CLK BUS are arranged to control the pre-programmed coarse gain of the Q-channel of the signal N. Thus, at time $T_5$, the coarse gain stage of the programmable gain amplifier begins a sampling phase by applying a coarse gain amount dictated by the arrangement of clock-derived signals on CGS CLK BUS to the Q-channel of the signal N, such as described above with regard to FIGS. 5 and 6. At the same time $T_5$, the fine gain stage of the programmable gain amplifier begins a hold phase, such as by transferring charges on an array of input capacitors to output capacitors as described above regarding FIG. 5. The fine gain stage begins to output the amplified data OUT at the time $T_5$, which is the amplified I-channel of input signal N.

At a time $T_6$, the clock-derived signals on the CGS CLK BUS go low, thus the coarse gain stage of the programmable gain amplifier ends the sampling phase by having fully sampled the Q-channel of the signal N. It is also at the time $T_6$ that the clock-derived signals on FGS CLK BUS go low, thus the fine gain stage has fully concluded its hold phase. The entirety of the fine gain applied to the I-channel of the signal N has been realized at the output of the fine gain stage, and has thus been fully output by the programmable gain amplifier. In this way, the I-channel of the signal N has been cascaded through both the coarse gain stage and the fine gain stage successively, with a combined coarse and fine gain applied to it.

At a time $T_7$, the selection signal I/Q remains low, thus the programmable gain amplifier is still applying a gain to the Q-channel of the signal N. The FGS_SEL signal goes low at the time $T_7$, thus the fine gain stage receives a signal arrangement from the clock-derived signals on FGS CLK BUS to apply a pre-programmed fine gain to the Q-channel of the signal N. Accordingly, it is at the time $T_7$ that the coarse gain stage of the programmable gain amplifier begins a hold phase. At the same time $T_7$, the fine gain stage of the programmable gain amplifier begins a sample phase by receiving the coarse gain amplified Q-channel of the signal N that is output from the coarse gain stage during its respective hold phase.

At a time $T_8$, the clock-derived signals on the FGS CLK BUS go low, thus the fine gain stage of the programmable gain amplifier ends the sampling phase, such as by acquiring the full amount of a charge on the array of input capacitors, as described above regarding FIG. 5. It is also at the time $T_8$ that the clock-derived signals on CGS CLK BUS go low, thus the coarse gain stage has fully concluded its hold phase. The entirety of the coarse gain applied to the Q-channel of the signal N has been realized at the output of the coarse gain stage, and has thus been fully sampled by the downstream fine gain stage. Also occurring at the time $T_8$, the selection signal I/Q goes high. The input multiplexer therefore switches back to the I-channel to apply a programmable gain to an I-channel of the signal N+1.

At a time $T_9$, the control signal CGS_SEL goes high. Therefore, the clock-derived signals on CGS CLK BUS are arranged to control the coarse gain of the I-channel of the signal N+1. Thus, at time $T_9$, the coarse gain stage of the programmable gain amplifier begins a sampling phase by applying a coarse gain amount dictated by the pre-programmed arrangement of clock-derived signals on CGS CLK BUS to the I-channel of the signal N+1, such as described above with regard to FIGS. 5 and 6. At the same time $T_9$, the fine gain stage of the programmable gain amplifier begins a hold phase, such as by transferring charges on an array of capacitors from an input stage to an output stage as described above regarding FIG. 5. The fine gain stage begins to output the amplified data OUT at the time $T_9$, which is the amplified Q-channel of input signal N.

At a time $T_{10}$, the clock-derived signals on the CGS CLK BUS go low, thus the coarse gain stage of the programmable gain amplifier ends the sampling phase by having fully sampled the I-channel of the signal N+1. It is also at the time $T_{10}$ that the clock-derived signals on FGS CLK BUS go low, thus the fine gain stage has fully concluded its hold phase. The entirety of the fine gain applied to the Q-channel of the signal N has been realized at the output of the fine gain stage, and has thus been fully output by the programmable gain amplifier. In this way, the Q-channel of the signal N has been cascaded through both the coarse gain stage and the fine gain stage successively, with a combined coarse and fine gain applied to it. Thus, at the time $T_{10}$, the programmable gain amplifier has output both channels of the entire input signal N.

The example of the timing diagram 200 thus continues to proceed by sequentially switching back and forth between amplified outputs of the successive input signals in a pipeline manner. It is to be appreciated that the above example of operation of the programmable gain amplifier could be equally applied to any multitude of input signals, and not to just an input signal with I-channel and Q-channel components.

Figure 8:
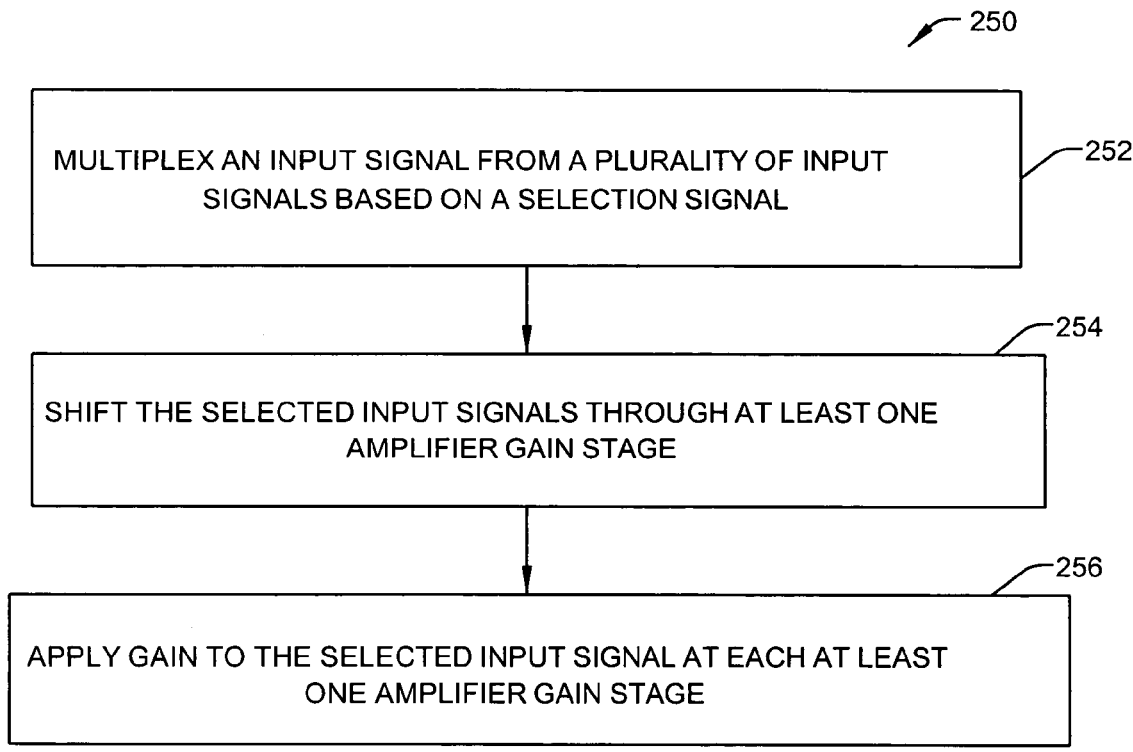
FIG. 8 illustrates a method of the operation of a programmable gain amplifier in accordance with an aspect of the invention.

In view of the foregoing structural and functional features described above, certain methods will be better appreciated with reference to FIG. 8. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., analog or digital circuitry, such as may be embodied in an application specific integrated circuit or a computer system), software (e.g., as executable instructions stored on a computer readable media or running on one or more computer systems), or any combination of hardware and software.

FIG. 8 illustrates a method 250 for amplifying a plurality of input signals in a programmable gain amplifier in accordance with an aspect of the invention. At 252, the method multiplexes a plurality of input signals based on a selection signal to select an input signal. The selection signal could be the selection signal SS in the example of FIG. 1. The selection signal is used to sequentially select an input signal from a plurality of input signals for amplification. At 254, the method shifts selected input signals through at least one amplifier gain stage. Each input signal that is shifted through the at least one amplifier gain stage is to be amplified by a set amount of gain associated with the selected input signal as it sequentially passes through the at least one amplifier gain stage. At 256, the method applies the gain to the selected input signal at each at least one amplifier gain stage. The gain applied at 256 can be based on gain settings that can be independently programmed to apply a given gain amount to the selected input signal.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A programmable gain amplifier comprising:
    an input multiplexer operative to sequentially select input signals for amplification from a plurality of input signals based on a selection signal;
    at least one amplifier gain stage operative to apply a variable gain amount to a selected input signal;
    a gain mapping component that controls the variable gain amount for each of the selected input signals and, further comprising:
    a non-overlapped clock generator that generates non-overlapping timing signals, wherein the gain mapping component derives gain clock signals from the non-overlapping timing signals for independently controlling the variable gain amount for each of the selected input signals.

2. The amplifier of claim 1, wherein the plurality of input signals are provided over a plurality of corresponding channels.

3. The amplifier of claim 2, wherein the plurality of corresponding channels comprise an in-phase channel and a quadrature channel.

4. The amplifier of claim 1, wherein the non-overlapping timing signals are generated from a system clock signal.

5. The amplifier of claim 1, wherein the at least one gain stage comprises a coarse gain stage and a fine gain stage.

6. The amplifier of claim 1, wherein the at least one gain stage comprises a switched capacitor gain stage.

7. The amplifier of claim 1, further comprising a gain monitoring component operative to provide digital signals corresponding to a gain amount for each of the plurality of input signals to the gain mapping component.

8. The amplifier of claim 7, wherein the gain monitoring component receives the output of the programmable gain amplifier to provide closed-loop gain control feedback to the gain mapping component.

9. The amplifier of claim 1, further comprising a control signal generator operative to select between a number of gain control signals corresponding to gain settings for each of the input signals.

10. A multi-channel programmable gain amplifier comprising:
an input multiplexer operative to sequentially select between a first input signal associated with a first channel and a second input signal associated with a second channel;
at least one amplifier gain stage operative to apply a variable gain amount to a selected input signal;
at least one control multiplexer that selects between providing a first gain control signal that sets the gain for the first input signal and a second gain control signal that sets a gain for the second input signal and,
further comprising at least one pain mapping component operative to receive the first and second gain control signals and to generate gain clock signals for variably and independently controlling the gain amount for each of the first and second input signals at the at least one amplifier gain stage.

11. The amplifier of claim 10, wherein the first channel comprises an in-phase channel and the second channel comprises a quadrature channel.

12. The amplifier of claim 10, further comprising a non-overlapped clock generator that generates non-overlapping timing signals from which the gain mapping component derives the gain clock signals.

13. The amplifier of claim 10, wherein the at least one amplifier gain stage comprises a coarse gain stage and a fine gain stage.

14. The amplifier of claim 13, wherein the at least one control multiplexer comprises a coarse gain control multiplexer operative to select between a first coarse gain control signal corresponding to the first input signal and a second coarse gain control signal corresponding to the second input signal, and a fine gain control multiplexer operative to select between a first fine gain control signal corresponding to the first input signal and a second fine gain control signal corresponding to the second input signal.

15. The amplifier of claim 14, wherein the at least one gain mapping component comprises a coarse gain mapping component operative to variably and independently control the gain amount for each of the first and second input signals at the coarse gain stage, and a fine gain mapping component operative to variably and independently control the gain amount for each of the first and second input signals at the fine gain stage.

16. The amplifier of claim 13, further comprising a first decoder corresponding to the first input signal and a second decoder corresponding to the second input signal, wherein the first decoder separates the first digital gain signal into a first coarse gain signal and a first fine gain signal, and the second decoder separates the second digital gain signal into a second coarse gain signal and a second fine gain signal.

17. The amplifier of claim 10, further comprising a gain monitoring component operative to receive the output of the programmable gain amplifier and to provide a first digital gain signal corresponding to a gain amount for the first input signal and a second digital gain signal corresponding to a gain amount for the second input signal.

18. The amplifier of claim 10, wherein the at least one gain stage comprises a coarse gain stage and a fine gain stage, and wherein a first and second coarse gain signals control the gain amount at the coarse gain stage for the first and second input signals, respectively, and a first and second fine gain signals control the gain amount at the fine gain stage for the first and second input signals, respectively.

19. A method for amplifying a plurality of input signals, the method comprising:
multiplexing the plurality of input signals based on a selection signal to sequentially select input signals for amplification;
shifting the selected input signals through at least one amplifier gain stage to provide a set amount of gain to the respective selected input signals; applying the set amount of gain at each of the at least one amplifier gain stage based on independent gain settings associated with respective selected input signals
and wherein the setting the amount of gain further comprises deriving gain clock signals from non-overlapping timing signals for independently controlling the variable gain amount for each of the selected input signals.

20. The method of claim 19, wherein the plurality of input signals are provided over a plurality of corresponding channels.

21. The method of claim 20, wherein the plurality of corresponding channels comprise an in-phase channel and a quadrature channel.

22. The method of claim 20, wherein the at least one gain stage comprises a coarse gain stage and a fine gain stage.

23. A system for amplifying a plurality of input signals, the system comprising: means for sequentially selecting an input signal for amplification from the plurality of input signals;
means for shifting the selected input signal through at least one amplifier gain stage;
means for varying the amount of gain at the at least one amplifier gain stage based on selecting a gain control signal corresponding to the selected input signal and means for generating non-overlapping clock signals, wherein the means for varying the amount of gain devices gain clock signals from the non-overlapping clock signals for independently controlling variable gain amount of the selected one of the plurality of input signals.

24. The system of claim 23, wherein the plurality of input signals are provided over a plurality of corresponding channels.

25. The system of claim 24, wherein the plurality of corresponding channels comprise an in-phase channel and a quadrature channel.

26. The system of claim 24, wherein the at least one gain stage comprises a coarse gain stage and a fine gain stage.

* * * * *